United States Patent [19]

Blake

[11] Patent Number: 5,633,506
[45] Date of Patent: May 27, 1997

[54] METHOD AND APPARATUS FOR IN SITU REMOVAL OF CONTAMINANTS FROM ION BEAM NEUTRALIZATION AND IMPLANTATION APPARATUSES

[75] Inventor: Julian G. Blake, Beverly Farms, Mass.

[73] Assignee: Eaton Corporation, Cleveland, Ohio

[21] Appl. No.: 519,708

[22] Filed: Aug. 28, 1995

Related U.S. Application Data

[63] Continuation-in-part of Ser. No. 503,299, Jul. 17, 1995, Pat. No. 5,554,854.

[51] Int. Cl.$^6$ ........................................ H01J 37/36
[52] U.S. Cl. .................... 250/492.21; 250/492.2; 250/251
[58] Field of Search ............... 250/492.21, 492.2, 250/398, 251; 134/1

[56] References Cited

U.S. PATENT DOCUMENTS

| | | | |
|---|---|---|---|
| 4,022,928 | 5/1977 | Piwcyzk | 427/43 |
| 4,665,315 | 5/1987 | Bacchetti et al. | 250/492.21 |
| 4,764,394 | 8/1988 | Conrad | 427/38 |
| 4,914,292 | 4/1990 | Tamai et al. | 250/251 |
| 4,987,933 | 1/1991 | Mack | 141/7 |
| 5,030,835 | 7/1991 | Tamai et al. | 250/492.2 |
| 5,308,989 | 5/1994 | Brubaker | 250/441.11 |
| 5,427,621 | 6/1995 | Gupta | 134/1 |
| 5,466,942 | 11/1995 | Sakai et al. | 250/492.21 |
| 5,554,854 | 9/1996 | Blake | 250/492.21 |

FOREIGN PATENT DOCUMENTS

| | | |
|---|---|---|
| 0140975 | 9/1984 | European Pat. Off. . |
| 0648861 | 4/1995 | European Pat. Off. . |

OTHER PUBLICATIONS

Materials Research Corporation, "The Basics of Plasmas," Hinson, Copyright 1984, pp. 1–36.

*Primary Examiner*—Jack I. Berman
*Assistant Examiner*—Kiet T. Nguyen
*Attorney, Agent, or Firm*—Watts, Hoffmann, Fisher & Heinke Co.

[57] ABSTRACT

Method and apparatus are provided for removal of contaminant material adhered to interior surfaces of an ion beam neutralization apparatus and ion implantation apparatus of an ion beam implanter. Contaminant material is removed from the neutralization apparatus and the implantation apparatus using a plasma glow discharge. The contaminant material is also removed from the neutralization apparatus by expanding the ion beam.

27 Claims, 4 Drawing Sheets

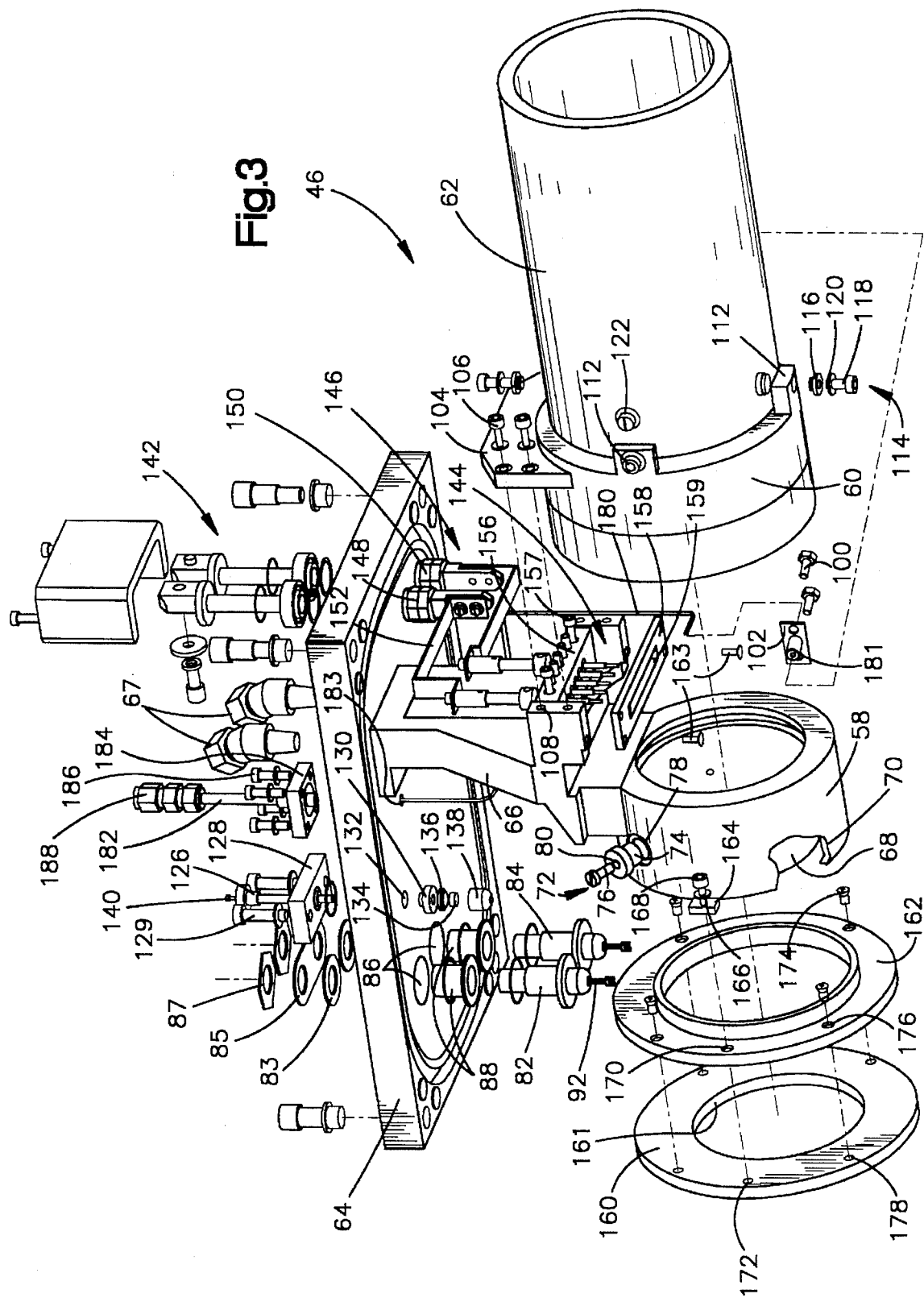

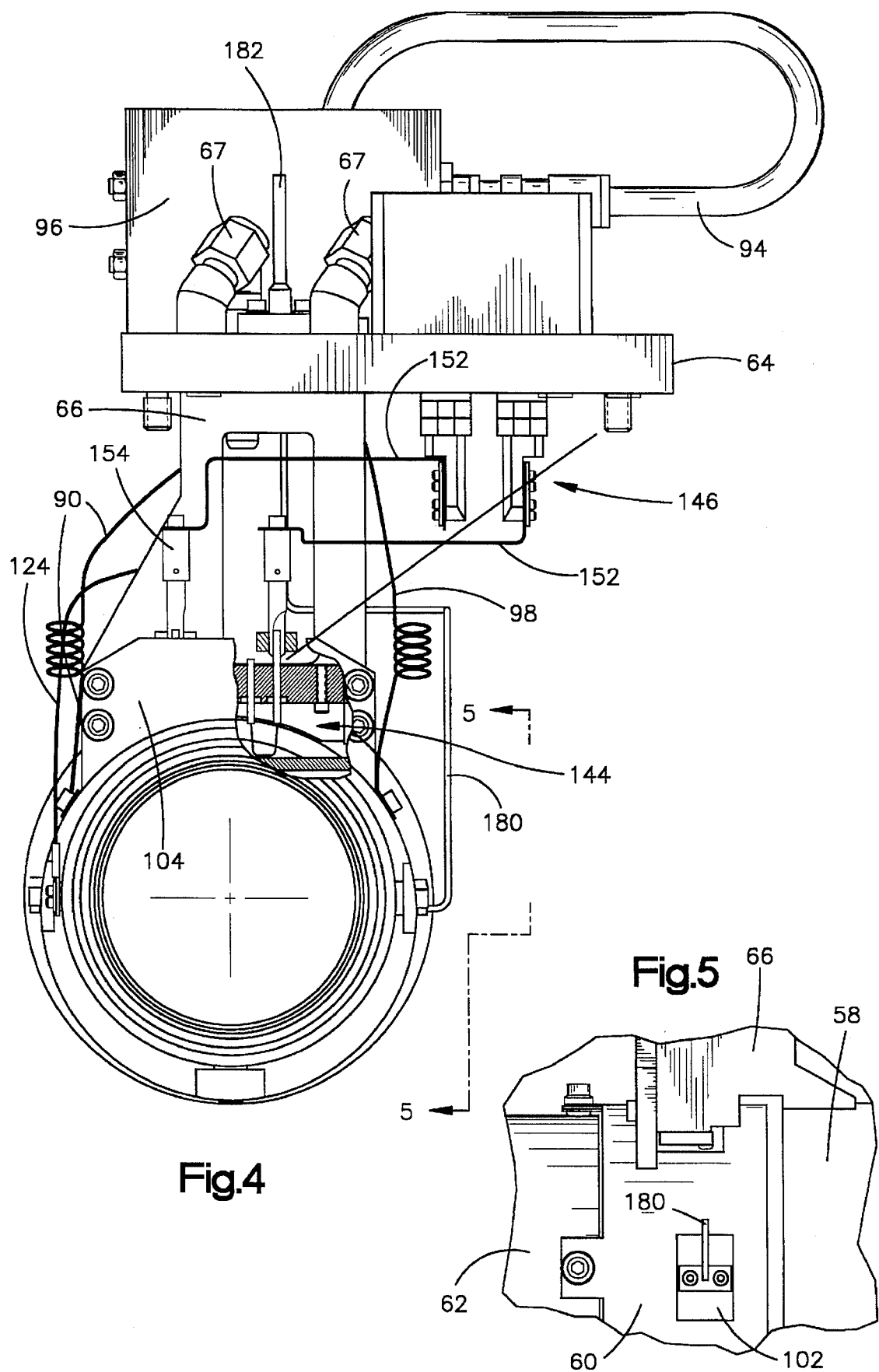

METHOD AND APPARATUS FOR IN SITU REMOVAL OF CONTAMINANTS FROM ION BEAM NEUTRALIZATION AND IMPLANTATION APPARATUSES

RELATED APPLICATION

This application is a continuation-in-part application of U.S. patent application Ser. No. 08/503,249 entitled, In Situ Removal of Contaminants from the Interior Surfaces of an Ion Beam Implanter, filed Jul. 17, 1995, now U.S. Pat. No. 5,554,854.

FIELD OF INVENTION

The present invention concerns method and apparatus for removal of contaminant materials adhering to interior surfaces of an ion beam neutralization apparatus and ion implantation chamber of an ion beam implanter.

BACKGROUND OF THE INVENTION

Ion beam implanters are used to implant or "dope" silicon wafers with impurities to produce n or p type extrinsic materials. The n and p type extrinsic materials are utilized in the production of semiconductor integrated circuits. As its name implies, the ion beam implanter dopes the silicon wafers with a selected ion species to produce the desired extrinsic material. Implanting ions generated from source materials such as antimony, arsenic or phosphorus results in n type extrinsic material wafers. If p type extrinsic material wafers are desired, ions generated with source materials such as boron, gallium or indium will be implanted.

The ion beam implanter includes an ion source for generating positively charged ions from ionizable source materials. The generated ions are formed into a beam and accelerated along a predetermined beam path to an implantation station. The ion beam implanter includes beam forming and shaping structure extending between the ion source and the implantation station. The beam forming and shaping structure maintains the ion beam and bounds an elongated interior cavity or region through which the beam passes en route to the implantation station. When operating the implanter, the interior region must be evacuated to reduce the probability of ions being deflected from the predetermined beam path as a result of collisions with air molecules.

For high current ion implanters, the wafers at the implantation station are mounted on a surface of a rotating support. As the support rotates, the wafers pass through the ion beam. Ions traveling along the beam path collide with and are implanted into the rotating wafers. A robotic arm withdraws wafers to be treated from a wafer cassette and positions the wafers on the wafer support surface. After treatment, the robotic arm removes the wafers from the wafer support surface and redeposits the treated wafers in the wafer cassette.

Operation of an ion implanter results in the production of certain contaminant materials. These contaminant materials adhere to interior surfaces of the ion beam neutralization apparatus and to the interior walls and wafer support of the implantation apparatus. Contaminant materials include undesirable species of ions generated in the ion source, that is, ions having the wrong atomic mass.

Another source of contaminant materials results from operating the implanter to implant different species of ions in consecutive implants. It is common practice to use the same implanter for implants utilizing different ions. For example, the implanter may be utilized to implant a quantity of wafers with boron ions having an AMU of 11 (atomic mass units). The boron implant may be followed by an implant of arsenic ions having an AMU of 75. Such consecutive implants with different ion species may lead to contamination of the second implant wafers with ions from the first implant. This is referred to as "cross specie contamination."

Another contaminant is photoresist material. Photoresist material is coated on the wafer surfaces prior to ion beam treatment of the wafer and is required to define circuitry on the completed integrated circuit. As ions strike the wafer surface, particles of the photoresist coating are dislodged from the wafer and settle on the wafer support surface or adjacent interior surfaces of the beam forming and shaping structure.

Over time, the contaminant materials build up on the interior surfaces of the ion beam implanter and on the wafer support surface and decrease the efficiency of the ion beam implanter and the quality of the treated wafers. As the contaminant materials build up on the implanter component surfaces, upper layers of contaminant materials flake off or are dislodged by ions which strike the contaminant materials, creating discharges and contaminating the implantation of the wafers. Some of the dislodged contaminant material moves along the beam path to the implantation station and is implanted in the wafers. Such contaminant material changes the electrical properties of the wafers. Even a small amount of contaminant material may render the implanted wafers unsuitable for their intended purpose in the manufacture of integrated circuits.

Additionally, buildup of contaminant materials on the interior surfaces of the ion implanter will reduce the efficiency of the ion beam neutralization apparatus. The ion beam neutralization apparatus (or "electron shower") introduces low energy electrons in the vicinity of the beam and wafer to (1) lower the beam potential, and (2) neutralize the charge deposited upon the wafer surface through arrival of positive ions and emission of secondary electrons.

These electrons may be generated by secondary electron emission (termed secondary emission shower). A buildup of contaminant on the target from which secondary electrons are emitted, or on other surfaces to which these electrons can migrate, alters the number and energy distribution of the electrons produced by the neutralization apparatus.

Neutralizing electrons can also be generated by extracting them from a plasma (termed plasma shower). Though no target is required for the plasma shower, the buildup of contaminant materials on surfaces of the neutralization apparatus will also alter the number and energy distribution of electrons, and hence degrade shower operation.

The contaminants deposited on the implanter interior surfaces must be periodically removed. Removing contaminant materials from the beam forming and shaping structure and the wafer support requires disassembly of the ion beam implanter. The contaminated components are removed from the implanter and carried to a cleaning station since certain dopant materials are toxic. Component surfaces are scrubbed with solvents and abrasives to remove the contaminant materials. The implanter is then reassembled and tested prior to resuming wafer treatment.

This cleaning procedure represents a significant economic cost in terms of implanter down time. In addition to the time required for cleaning the components, reassembly of the implanter is a slow process. Precise alignment of the implanter components must be achieved for proper operation of the implanter. Additionally, the vacuum in the interior region of the implanter must be reestablished prior to operation. Finally, it is standard operating procedure not to allow a production run on an implanter that has been disassembled until it is requalified by implanting test wafers and evaluating the wafers.

DISCLOSURE OF THE INVENTION

The present invention provides method and apparatus for in situ removal of contaminant material adhering to interior surfaces of an ion beam implanter. In accordance with the invention, a self-cleaning ion beam neutralization apparatus is provided that normally extends around a path of an ion beam in an ion beam implantation system. The neutralization apparatus includes a hollow body connected to a grounded support flange extending from support structure of the ion beam implantation system. An electron emitting apparatus is provided for normally emitting high energy electrons to an inner wall of the body to cause neutralizing electrons to enter the ion beam.

A first aperture defining member is disposed upstream of and electrically isolated from the body with respect to a direction of travel of ions in the ion beam. A second aperture defining member is disposed upstream of and electrically isolated from the first aperture defining member with respect to the ion travel direction. An elongated hollow member is disposed downstream of and electrically isolated from the body with respect to the ion travel direction.

A cleaning apparatus is provided for creating a plasma glow discharge to clean contaminant material from at least one component selected from the group consisting of the body, the first aperture defining member, the second aperture defining member and the elongated member. An apparatus is provided for feeding a reactive gas into the neutralization apparatus. A biasing apparatus is provided for applying a negative electrical bias to the component to be cleaned and grounding at least one of the other components. The electron emitting means is energized to initiate the plasma glow discharge. A pump is provided for pumping contaminant material from the neutralization apparatus.

A method of cleaning contaminant material adhered to interior surfaces of the neutralization apparatus includes the step of feeding a reactive gas to the neutralization apparatus. A negative electrical bias is applied to at least one of the components of the neutralization apparatus. At least one of the components that does not have the negative bias applied thereto is grounded. A plasma glow discharge is created in the neutralization apparatus to remove contaminant material from the components. The contaminant material is removed from the neutralization apparatus.

More specifically, the reactive gas is one or more gases selected from the group consisting of hydrogen, fluorine, and oxygen. The pressure in the neutralization apparatus is adjusted to above vacuum pressure. A source of electrons is provided to initiate the glow discharge. The gas reacts with the contaminant material to produce a volatile species of the contaminant material, which is removed from the neutralization apparatus.

In preferred form, a method of cleaning contaminant material adhered to interior surfaces of the ion beam neutralization apparatus includes the steps of feeding a reactive gas to the neutralization apparatus. A negative electrical bias is applied to at least one component selected from the group consisting of the body, the first aperture defining member, the second aperture defining member, and the elongated member. At least one of the components that does not have the negative bias applied thereto is grounded. A plasma glow discharge is created in the neutralization apparatus causing the reactive gas to react with contaminant material adhered to the component having the negative bias applied thereto to produce a gaseous reaction product of the contaminant material. The reaction product is removed from the neutralization apparatus.

Another embodiment of the invention is directed to a method of cleaning contaminants adhered to interior surfaces of the neutralization apparatus that includes the step of extracting ions from source materials and forming the ions into an ion beam that traverses a beam path through an evacuated region along a trajectory to an ion implantation chamber. The ion beam is expanded in the neutralization apparatus into contact with contaminant material adhered to interior surfaces of the neutralization apparatus. The contaminant material is removed from the neutralization apparatus.

The ion beam is expanded in the neutralization apparatus by adjusting the energy of the beam and energizing the biased aperture to a range of 5–10 kilo-electron volts. The source materials are selected to form a volatile species of the contaminant material.

Another embodiment of the invention relates to a self-cleaning ion implantation apparatus that normally intercepts a path of an ion beam in an ion beam implantation system. The implantation apparatus includes a housing having an inner wall that defines an ion beam implantation chamber. A rotatable wafer support is located in the implantation chamber for supporting wafers that are normally doped by the ion beam.

A cleaning apparatus is provided for creating a plasma glow discharge in the implantation chamber to clean contaminant material adhered to the inner wall and the wafer support. An apparatus is provided for feeding a reactive gas into the implantation chamber. A biasing device is provided for applying a negative electrical bias to either the inner wall or the wafer support while grounding the other. The cleaning apparatus may also include an electrode extending into and electrically isolated from the housing, the electrode having a positive electrical bias applied thereto. An electron emitting device is activated to initiate the glow discharge. A pump is provided for pumping the contaminant material from the ion implantation apparatus.

One method of cleaning contaminant material adhering to the ion implantation apparatus includes the step of feeding a reactive gas to the ion implantation apparatus. A positive electrical bias is applied to the electrode member. A plasma glow discharge is created in the implantation chamber to remove contaminant material adhered to the chamber wall and the support. The contaminant material is removed from the implantation chamber. The pressure in the implantation chamber is preferably adjusted to above vacuum pressure, and a source of electrons is preferably provided to initiate the plasma glow discharge.

Another method of cleaning the ion implantation apparatus includes the step of feeding a reactive gas to the ion implantation apparatus. A negative electrical bias is applied to either the chamber wall or the support. The chamber wall or the support that does not have the applied negative bias is grounded. A plasma glow discharge is created in the implantation chamber to remove contaminant material adhered to the chamber wall or the support that has the applied negative bias. The contaminant material is removed from the implantation chamber.

These and other objects, advantages and features of the invention will become better understood from a detailed description of a preferred embodiment of the invention which is described in conjunction with the accompanying drawings.

BRIEF DESCRIPTION OF THE DRAWINGS

FIG. 3 is an exploded perspective view of the ion beam neutralization apparatus shown in FIG. 2;

FIG. 4 is an end view of an ion beam neutralization apparatus as seen approximately from the plane designated by lines 4—4 in FIG. 2; and FIG. 5 is a view as seen approximately from the plane designated by lines 5—5 in FIG. 4.

DETAILED DESCRIPTION OF PREFERRED EMBODIMENTS

Operation of Implanter

Figure 1:
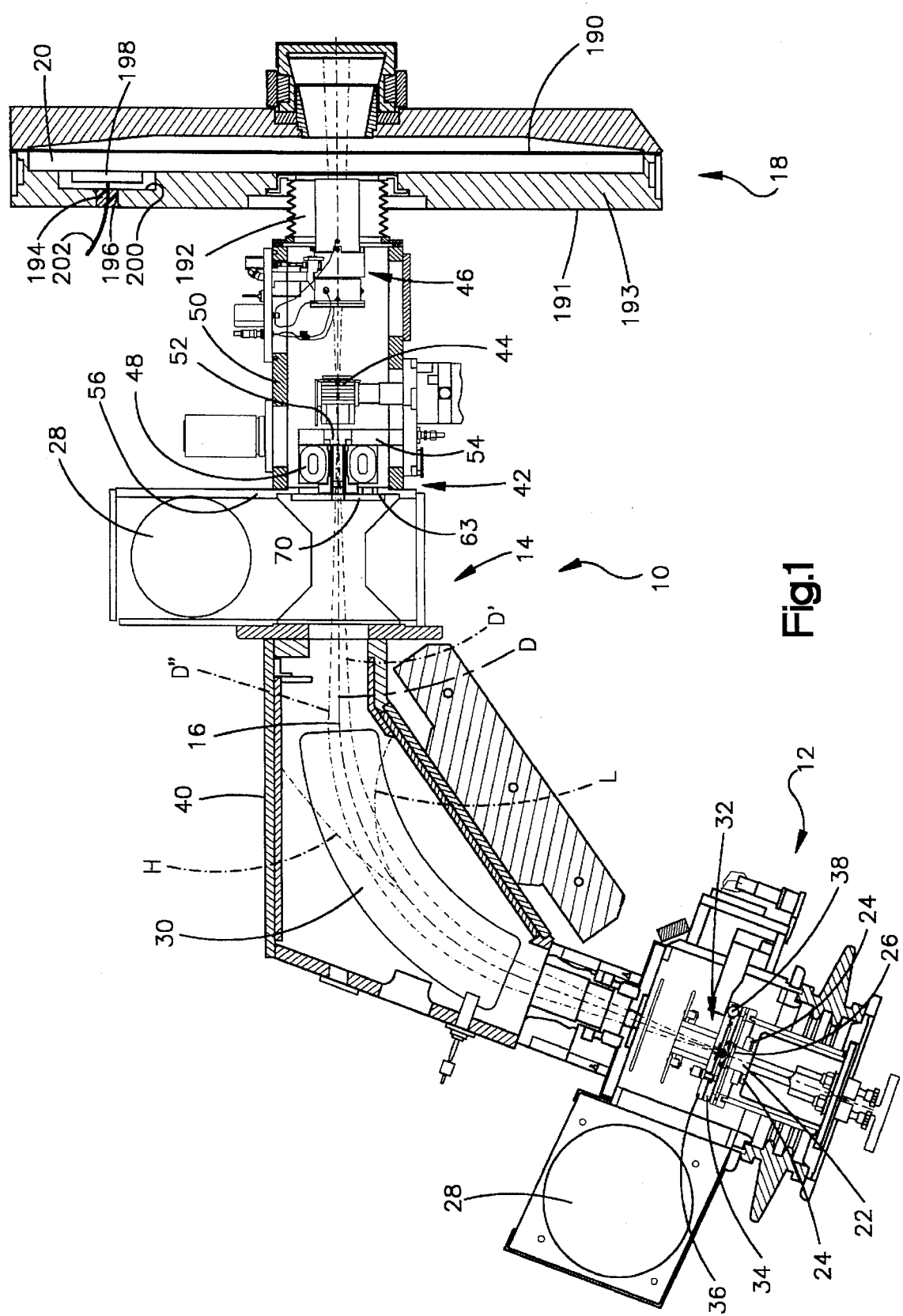
FIG. 1 is a top view, partly in section, showing an ion beam implanter including an ion beam neutralization apparatus and an ion implantation chamber.

Turning now to the drawings, FIG. 1 depicts an ion beam implanter shown generally at 10, which includes an ion source 12, apparatus shown generally at 14 for forming and shaping an ion beam 16, and an implantation station 18. Control electronics (not shown) are provided for monitoring and controlling the ion dosage received by the wafers (not shown) within an implantation chamber 20 at the implantation station 18. The ions in the ion beam follow a predetermined, desired beam path labeled "D" in FIG. 1. The beam path D has varying amounts of divergence as the beam traverses the distance between the ion source 12 and the implantation station 18. The "limits" of the predetermined beam path D caused by beam divergence have been labeled "D'" and "D''" respectively in FIG. 1.

The ion source 12 includes a plasma chamber 22 defining an interior region into which source materials are injected. The source materials may include an ionizable gas or vaporized source material. Source material in solid form is deposited into a pair of vaporizers 24. The vaporized source material is then injected into the plasma chamber 22. If a p-type dopant is desired, boron, gallium or indium may be used. If an n-type dopant is desired, antimony, arsenic or phosphorus may be used.

Energy is applied to the source materials to generate positively charged ions in the plasma chamber 22. The positively charged ions exit the plasma chamber interior through an elliptical arc slit in a cover plate 26 overlying an open side of the plasma chamber 22.

An ion source utilizing microwave energy to ionize source materials is disclosed in U.S. patent application Ser. No. 08/312,142, filed Sep. 26, 1994, which is assigned to the assignee of the instant application. U.S. patent application Ser. No. 08/312,142 is incorporated herein by reference in its entirety. The ion beam 16 travels through an evacuated path from the ion source 12 to the implantation chamber 20, which is also evacuated. Evacuation of the beam path is provided by vacuum pumps 28.

Ions in the plasma chamber 22 are extracted through the arc slit in the plasma chamber cover plate 26 and accelerated toward a mass analyzing magnet 30 by a set of electrodes 32 adjacent the plasma chamber cover plate 26. The electrodes 32 extract the ions from the plasma chamber interior and accelerate the ions into a region bounded by the mass analyzing or resolving magnet 30. The set of electrodes 32 includes a suppression electrode 34 and an extraction electrode 36 spaced apart from the suppression electrode 34 by a set of three spherical insulators 38 (only one of which can be seen in FIG. 1).

During operation of the implanter 10, the suppression electrode 34 is energized at a negative voltage to minimize backstreaming of ions exiting the plasma chamber 22. The plasma chamber 22 is energized at a high positive potential and the extraction electrode 36 is set to ground potential to extract positive ions from the plasma chamber 22. Each electrode 34, 36 is comprised of matching semicircular disk halves which are spaced apart to define a gap through which the ions pass.

When ions travel along the ion beam 16, they move from the ion source 12 into a magnetic field set up by the mass analyzing magnet 30. The mass analyzing magnet 30 is part of the ion beam forming and shaping structure 14 and is supported within a magnet housing 40. The strength and orientation of the magnetic field is controlled by the control electronics (not shown). The mass analyzing magnet 30 includes a magnet yoke (not shown) bounded by field windings (also not shown). The magnet's field is controlled by adjusting a current through the magnet's field windings. Along the ion beam travel path from the mass analyzing magnet 30 to the implantation station 18, the ion beam 16 is further shaped, evaluated and accelerated due to the potential drop from the high voltage of the mass analyzing magnet housing 40 to the grounded implantation chamber 20.

The mass analyzing magnet 30 causes only those ions having an appropriate mass to reach the ion implantation station 18. The ionization of source materials in the plasma chamber 22 generates a species of positively charged ions having a desired atomic mass. However, in addition to the desired species of ions, the ionization process will also generate a proportion of ions having other than the proper atomic mass. Ions having an atomic mass above or below the proper atomic mass are not suitable for implantation and are referred to as undesirable species.

The magnetic field generated by the mass analyzing magnet 30 causes the ions in the ion beam to move in a curved trajectory. The magnetic field strength is established by the control circuitry (not shown). The magnetic field is established such that only ions having an atomic mass equal to the atomic mass of the desired ion species traverse the beam path to the implantation chamber 20.

The desired species moves along the path D, or more accurately, within the ion beam path "envelope" defined by D' and D", since there is always some degree of beam divergence as a result of the repulsive force of like charged ions (all the ions having a positive charge).

In FIG. 1, a path labeled "H" illustrates a trajectory path of an undesirable ion which has an atomic mass much heavier (approximately 50% heavier in atomic mass) than the desired ion species being implanted. A path labeled "L" illustrates a trajectory path of an undesirable ion which has an atomic mass much lighter (approximately 50% lighter in atomic mass) than the desired ion species being implanted. The undesirable ions that have an atomic mass much lighter or much heavier than the atomic mass of the desired ion species diverge sharply from the predetermined, desired beam path D when passing through the mass analyzing magnet magnetic field and impact the mass analyzing magnet housing 40.

The ion beam forming and shaping structure 14 further includes a quadrapole assembly 42, a pivotable Faraday cup 44 and an ion beam neutralization apparatus 46. The quadrapole assembly 42 includes a set of magnets 48 oriented around the ion beam 16 that are selectively energized by the control electronics (not shown) to adjust the height of the ion beam 16. The quadrapole assembly 42 is supported within a housing 50.

Coupled to an end of the quadrapole assembly 42 facing the Faraday flag 44 is an ion beam resolving plate 52. The resolving plate 52 is comprised of vitreous graphite. The resolving plate 52 includes an elongated aperture through which the ions in the ion beam 16 pass as they exit the quadrapole assembly 42. The resolving plate 52 functions in conjunction with the mass analyzing magnet 30 to eliminate undesirable ion species from the ion beam 16 which have an atomic mass close to, but not identical to, the atomic mass of the desired species of ions. For a discussion of the resolving plate, see the U.S. patent application Ser. No. 08/503,299 to Blake entitled In Situ Removal of Contaminants From the Interior Surfaces of an Ion Beam Implanter, filed Jul. 17, 1995, now U.S. Pat. No. 5,554,854.

The quadrapole assembly 42 is supported by a support bracket 54 and a support plate 56. The support bracket 54 is coupled to an interior surface of the housing 50 while the support plate 56 is coupled to an end of the housing 50 via a plurality of screws. Attached to the support plate 56 is a quadrapole assembly shield plate (not shown). The quadrapole assembly shield plate protects the quadrapole assembly 42 from impact by undesirable ions having an atomic mass that is "close" enough to the atomic mass of the desired ion species to avoid impact with the housing 50 after passing through the mass analyzing magnet magnetic field yet different enough from the atomic mass of the desired species to be deflected by the magnetic field to a greater extent than those ions impacting the resolving plate 52. During operation of the implanter 10, undesirable ions impacting an upstream facing surface of the quadrapole assembly shield plate build-up on the plate. For a discussion of the quadrapole assembly shield plate, see the U.S. patent application Ser. No. 08/503,299 to Blake filed Jul. 17, 1995, now U.S. Pat. No. 5,554,854.

As can be seen in FIG. 1, the Faraday flag 44 is located between the quadrapole assembly 42 and the ion beam neutralization apparatus 46. The Faraday flag 44 is pivotably coupled to the housing 50 so that it can be pivoted into position to intersect the ion beam 16 to measure beam characteristics and, when the measurements are satisfactory, swung out of the beam line so as not to interfere with wafer implantation at the implantation chamber 20.

The ion beam neutralization apparatus 46 is commonly referred to as an electron shower. U.S. Pat. No. 5,164,599 to Benveniste, issued Nov. 17, 1992, discloses an electron shower apparatus in an ion beam implanter, and is incorporated herein by reference in its entirety. The ions extracted from the plasma chamber 22 are positively charged. If the positive charge on the ions is not neutralized prior to implantation of the wafers, the doped wafers will exhibit a net positive charge. As described in the '599 patent, such a net positively charged wafer has undesirable characteristics.

Figure 2:
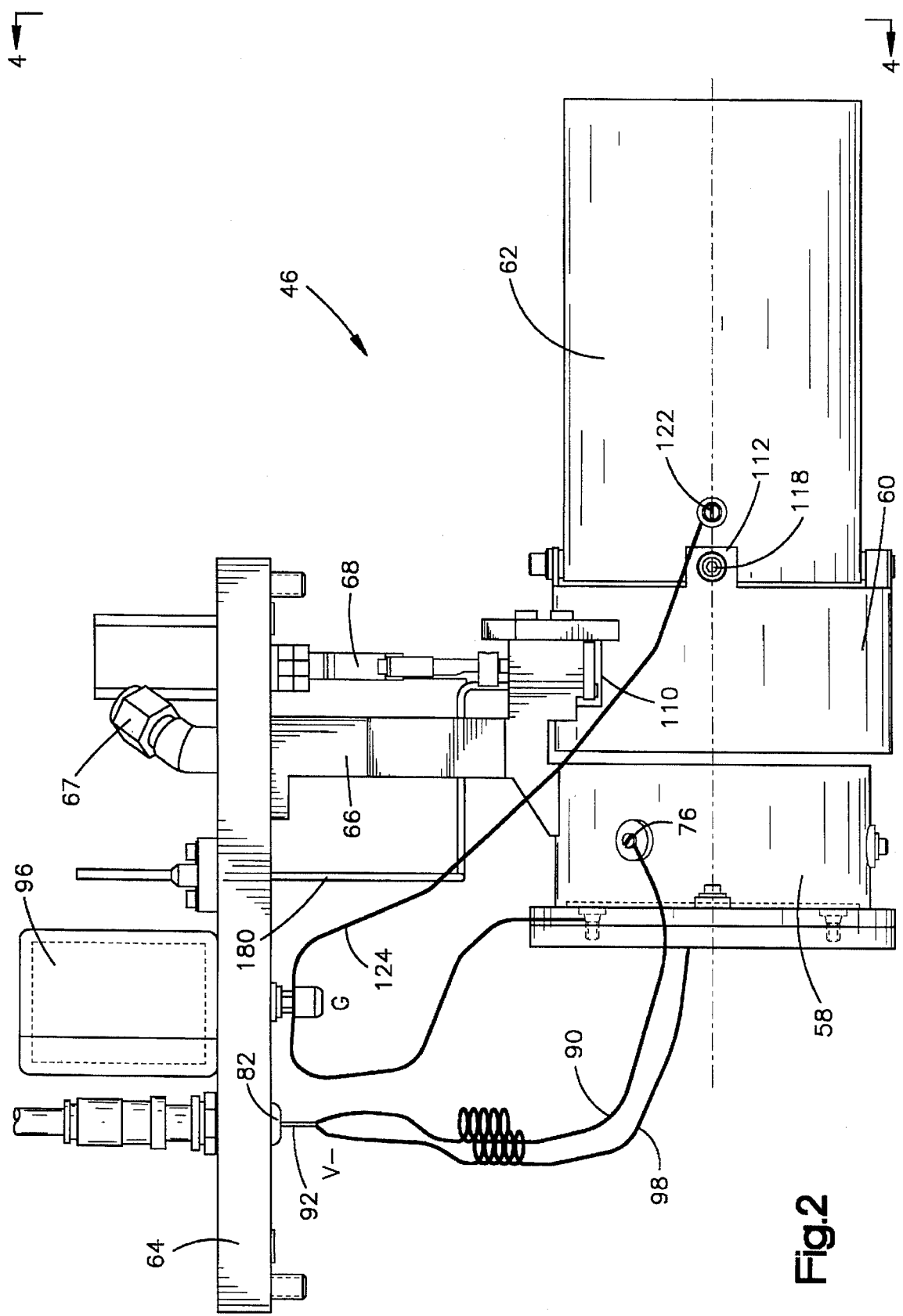
FIG. 2 is an enlarged top plan view of an ion beam neutralization apparatus of the ion beam implanter of FIG. 1.

The neutralization apparatus 46, best shown in FIGS. 2 and 3, includes an aperture defining member 58 (referred to herein as a biased aperture), a target 60 and an extension tube 62. Each of the biased aperture 58, the target 60 and the extension tube 62 is hollow and when assembled defines an open ended, cylindrical interior region through which the ion beam 16 passes and is normally neutralized by secondary electron emissions.

The neutralization apparatus 46 is positioned with respect to the housing 50 by a mounting flange 64 that is bolted to the housing 50. The flange 64 is made of an electrically insulating material. Extending from the mounting flange 64 is a support member 66. The support member 66 defines an interior passageway (not shown) for the circulation of cooling fluid. Two fittings 67 are used to connect a water feed line (not shown) to the support member passageway.

The biased aperture 58 is integrally formed with the support member 66. The biased aperture 58 includes a cylindrical wall 70 and a ring 68 disposed within an opening defined by the cylindrical wall 70. The ring 68 is electrically isolated from the wall 70 by at least two electrically insulating members 72, one of which is shown in FIG. 3. Each insulating member 72 includes a plug 74 formed of electrically insulating material such as rubber, and an electrically conductive screw 76. Each plug 74 is inserted into an opening 78 in the cylindrical wall 70, and each screw 76 is inserted through an opening 80 in the plug 74 to contact the ring 68. The screws 76 space the ring 68 from the wall 70 so that the ring 68 is electrically isolated from the wall 70.

Two electrical feed-throughs 82, 84 extend through openings 86 in the mounting flange 64. Each of the feed-throughs 82, 84 is inserted into an electrically insulated plug 88 formed of rubber or the like. The feed-throughs 82, 84 are each coupled to electrical connectors (not shown) leading from a neutralization apparatus controller (also not shown). The feed-through 82 energizes the ring 68 to a negative voltage V- through a lead 90 extending between a conductor 92 and one of the screws 76 (FIG. 2).

The feed-through 84 is connected by a conductor (not shown) within a conduit 94 (FIG. 4) to circuitry within a housing 96 for monitoring current in the biased aperture 58. A conductor 92 of the feed-through 84 is electrically connected to the biased aperture 58 via a lead 98 extending to another of the screws 76. The feed-throughs 82 and 84 are secured to the flange 64 by washers 83, a gasket 85 and nuts 87.

The biased aperture 58 functions as a gate to prevent any positive charge that accumulates on the wafers from depleting the ion beam 16 upstream of the neutralization apparatus 46 of neutralizing electrons. If such a depletion was to occur, the ion beam 16 would blow up due to space charge, and transport would become very inefficient.

The support member 66 has four tapped holes 108. The target 60 has a flange 104 and is connected to the support member 66 by threading four screws 106 into the holes 108. The target 60 has an opening 110 formed along its circumference adjacent the support member 66. The target 60 has four tabs 112 each with an opening for accommodating an insulating member 114. Each insulating member 114 includes an exteriorly threaded plug 116 made of insulating material extending into an opening in one of the tabs 112. Nonconductive screws 118 are each threaded into an opening of the plug 116 into an opening in the extension tube 62. Washers 120 secure each of the screws 118 in place. The screws 118 couple the extension tube 62 to the target 60, while electrically isolating the extension tube 62 from the target 60. The extension tube 62 is grounded by a connection via a lead 124 between a screw 122 fastened to the extension tube 62 and a grounding terminal G.

As shown in FIG. 3, a grounding conductor 126 for the terminal G extends through an opening in a mounting plate 128 and an opening 132 in the mounting flange 64. The plate 128 is mounted to the flange 64 by two screws 129 that are threaded into holes tapped into the flange 64.

An insulating plug 130 is received in the opening 132 of the flange 64. A nut 134 is threaded onto a threaded end of the feed-through 126, which secures the feed-through 126 in place with a washer 136. The lead 124 is connected to the end of the feed-through 126 by a cap 138. A screw 140 is screwed into the other end of the conductor 126. A ground wire (not shown) is connected to the screw 140 of the conductor 126.

Two filament feed-throughs 142 extend through openings in the mounting flange 64 and are electrically coupled to a set of filaments 144. Two support members 146 are each secured to the flange 64 by a nut 148 mounted on an insulator ring 150. Two conductor members 152 made of electrically conductive material are each fastened to one of the support members 146. Each of the conductor members 152 receives a filament support 154 (FIG. 4). The filaments 144 are supported by the filament supports 154 and electrically coupled to the conductor members 152.

A filament support plate 156 is fastened to the support member 66 with screws 157 and has a plurality of holes that receive the filaments 144. A fixture 158 is fastened to the support member 66 by screws 163, and has an opening 159 through which the filaments 144 extend into the interior of the target 60. The target 60 is connected to the support member 66, which is grounded. Thus, the target 60 is also grounded.

During normal operation, when the filaments 144 are energized by providing current to the feed-throughs 142, the filaments 144 emit high energy electrons that are accelerated into an interior region of the target 60. The high energy electrons impact the interior wall of the target 60. The collisions of the high energy electrons with the target interior wall result in the emission of low energy electrons or so-called secondary electron emission.

During normal operation, as the positively charged ions in the ion beam 16 pass through the negatively charged field set up in the interior region of the biased aperture 58, the beam undergoes an increase in the degree of beam divergence. The positively charged ions have a natural repulsive force on each other because of their like charges. Passing the beam 16 through the biased aperture electrical field increases beam divergence.

Collisions between ions in the ion beam 16 and residual gas atoms create low energy electrons that make the transport of a high density ion beam possible. Despite this space charge neutralization, the beam potential is higher than desirable. Circuitry (not shown) etched on the doped wafers is susceptible to positive charging damage from beam potential that is too high. Low energy secondary electrons generated by the neutralization apparatus 46 are attracted to the positively charged ion beam 16 and further lower the beam potential. This reduces the probability of charging damage to the circuitry.

During normal operation of the implanter 10, the extension tube 62 functions to prevent primary electrons emitted from the filaments 144 from entering the implantation chamber 20, where they could impact the wafers directly and cause damage. The extension tube 62 also functions to provide a ground plane close to the beam 16, which reduces beam potential.

A graphite ring 160 defining an aperture 161 is connected to the biased aperture 58. An electrically insulating ring 162 electrically isolates the ring 160 from the biased aperture 58. This connection is effected by a tab 164 on the biased aperture 58 having a hole therein that receives an electrically insulating, exteriorly threaded plug 166 therein. The plug 166 receives a nonconductive screw 168 through an opening therein.

The aperture defining ring 160 is connected to the biased aperture 58 by threading the plug 166 into the opening in the tab 164 and threading the screw 168 through the opening in the plug. The screw 168 is threaded into an opening 170 in the insulating ring 162 and an opening 172 in the ring 160. Screws 174 each extend through an opening 176 in the insulating ring 162 and an opening 178 in the graphite ring 160 to secure the insulating ring 162 and the graphite ring 160 together. The ground lead 124 is connected to one of the screws 174 (FIG. 2) to normally ground the graphite ring 160. The arrangement of the biased aperture 58 and the graphite ring 160 prevents low energy electrons from leaving the neutralization apparatus 46.

A gas feed line 180 extends from the mounting flange 64 and is inserted at one end into an opening 181 in a plate 102 connected to the target 60 by two screws 100. A gas bleed feed-through 182 is coupled to the other end of the feed line 180 by a plate 184 that is fastened to the flange 64 with four screws 186 that each extend into a tapped opening in the flange 64. The gas bleed feed-through 182 extends into an opening in the plate 184 and into an opening 183 in the flange 64. The feed-through 182 has a fitting 188 on the end for connection to a gas source (not shown). During normal operation of the neutralization apparatus 46, low concentrations of argon gas are injected into the interior region of the target 60 via the gas feed line 180. The emission of secondary electrons is enhanced by the presence of the argon gas during normal operation.

As can be seen in FIG. 1, a downstream end of the extension tube 62 is adjacent the implantation chamber 20 where the wafers are implanted with ions. The wafers are frequently coated with photoresist material (not shown) prior to ion beam treatment. The photoresist is primarily hydrocarbon material. As the ions impact the wafer surface, particles of the photoresist coating are dislodged from the wafer and settle on a surface of the wafer support 190 and, because of the proximity of the extension tube 62 to the implantation chamber 20, also condenses on inner and outer surfaces of the extension tube 62 during operation of the implanter.

The implantation station 18 includes a housing 191 that has chamber walls 193 that define the implantation chamber 20. Rotatably supported within the implantation chamber 20 is the wafer support 190, which is disk-shaped. The wafer support 190 is electrically isolated from the chamber walls 193 of the implantation chamber 20. Wafers to be treated are positioned near a peripheral edge of the wafer support 190 and the support is rotated by a motor (not shown) at about 1200 RPM. The ion beam 16 impinges and treats the wafers as they rotate in a circular path. The implantation station 18 is pivotable with respect to the housing 50 and is connected thereto by a flexible bellows 192. The ability to pivot the implantation station 18 permits adjustments to the angle of incidence of the ion beam 16 on the wafer implantation surface.

The implantation chamber 20 may be provided with an electrically insulating feed-through 194 that extends through an opening 196 in one of the walls 193. An electrode 198 (shown here as a plate of a few inches in diameter) is disposed in a recess 200 in the walls 193. An electrical connection 202 extends through the feed-through 194 to the electrode 198.

In Situ Cleaning of the Ion Beam Neutralization Apparatus

During operation of the implanter 10, contaminant materials in the form of dopant material, photoresist material and undesirable species of ions build up on surfaces of the ion beam neutralization apparatus 46 and in the implantation chamber 20. Such contamination build up interferes with proper operation of these apparatuses.

The present invention employs a plasma glow discharge to clean selected components of the neutralization apparatus 46 and the implantation chamber 20. A plasma glow discharge may be used to clean contaminated components by either sputtering or reactive ion etching.

The primary mechanism during the plasma glow discharge by which the present invention cleans selected components of the neutralization apparatus 46 and the implantation chamber 20 is reactive ion etching. The plasma glow discharge is created by raising the pressure in the neutralization apparatus 46 to a pressure ranging from $1\times10^{-3}$ to $1\times10^{-4}$ torr and continuously feeding a reactive gas via the gas feed line 180 into the target 60, while applying a negative bias to the component to be cleaned, thereby making this component a cathode. Any component that is selected for cleaning and to which a negative bias is applied is referred to herein as a cathode.

Electrons are emitted from the cathode due to application of the negative bias to it. By emitting electrons into the gas volume, the reactive gas atoms that are continuously fed into the neutralization apparatus 46 are ionized. Each ionization of a reactive gas atom produces a gas ion and releases an electron. Upon generating a high ionization density in the gas volume, a plasma glow discharge is produced.

The plasma glow discharge is created by a recombination of gas ions and electrons to achieve a lower energy state, which causes the gas ions in the plasma to radiate and produce the "glow" of the glow discharge. Once the plasma glow discharge has been established, a glowing plasma volume is generated, a plasma is established, and a so-called dark space sheath is created in regions around the inner walls of the cathode.

A dark space sheath is defined as a region surrounding a plasma in which an electric field is established to retard electron loss from the plasma volume. This dark space sheath is set up by application of an electric potential to conductors that bound the plasma. In the dark space sheath electrons are "rejected" by the electric field of either an external applied voltage or the potential of the plasma with respect to ground. Recombination between ions and electrons is difficult in the dark space sheath, thereby making this region dark.

An electric field of the dark space sheath accelerates gas ions toward the inner surface of the cathode. The dark space sheath also accelerates secondary electrons into the plasma. During reactive ion etching that occurs in the cleaning of the cathode, the chemically reactive gas ions are directed toward the interior surface of the cathode, where they chemically react with the contaminant material. This produces a reaction product or volatile gaseous species of the reactive gas and the contaminant material. The gaseous species is pumped out of the neutralization apparatus 46 by the vacuum pumps 28.

The filaments 144 are preferably energized to assist the creation of the plasma glow discharge. The energized filaments release high energy electrons that impact the interior surface of the target 60. This in turn produces secondary electrons that are accelerated into the gas volume to ionize more gas particles, which generates more electrons in the gas volume. This supply of electrons and continuous pumping of reactive gas atoms into the cathode, sustains the plasma glow discharge. The process of removing contaminants using chemically reactive gas ions and plasma glow discharge is described in a publication entitled, *The Basics of Plasmas*, by David C. Hinson, Copyright 1984, Materials Research Corporation of Orangeberg, N.Y., which is incorporated herein by reference.

If the target 60 is to be cleaned, a negative bias is applied to it preferably by applying a negative bias to the flange 64. The negative bias is applied to the flange 64 from an outside power source (not shown) through either the feed-through 82 and lead 98 or the feed-through 84 and lead 90. At least one other of the components, such as the grounded extension tube 62, and/or the grounded target 60, functions as an anode.

When cleaning the biased aperture 58, a negative bias is applied to it from the outside power source through either the feed-through 82 and lead 98 or the feed-through 84 and lead 90. At least one other of the components, such as the grounded extension tube 62, and/or the grounded target 60, functions as an anode.

If the graphite aperture 160 is to be cleaned, a negative bias is applied to it from the outside power source through the grounding terminal G and the lead 124. At least one other of the components, such as the grounded extension tube 62, and/or the grounded target 60, functions as an anode.

When cleaning the extension tube 62, a negative bias is applied to it from the outside power source through the grounding terminal G and lead 124. At least one other of the components, such as the grounded target 60, functions as an anode.

Regarding suitable parameters for the cleaning process of the neutralization apparatus 46, a cathode voltage of about 300 volts is expected to be used. The cathode current is expected to be in a range of between 150 milliamps to 300 milliamps. The filament voltage and current are expected to be about 12 volts and about 15 amps, respectively. The gas flow rate is expected to be in a range of 5 to 10 standard cubic centimeters per minute. The cleaning time is expected to range from 2 to 10 minutes.

Regarding the type of gas to use during the cleaning procedure, it is noted that during operation of the implanter 10, argon gas is often used as the source gas introduced into the plasma chamber to generate ions. However, cleaning contaminants using argon as the ion beam source gas has proven undesirable. Argon dislodges contaminant material only by sputtering. Such sputtered material will redeposit on other implanter surfaces through condensation. Thus, in situ cleaning of implanter components using an argon ion beam results in redistribution of contaminant material.

Instead of using argon as the source gas when in situ cleaning is to be performed, a reactive gas such as oxygen, hydrogen or fluorine is used as the cleaning gas. Using such gas results in a chemical reaction between the gas ions and the contaminant material, which produces a reaction product that is a volatile species of the contaminant material. This volatile species of the contaminant material can be pumped out of the implanter by the vacuum pumps 28 and vented outside the implanter.

For example, if boron 10 is the contaminant material adhering to the target 60, using hydrogen as the source gas would result in the contaminant material being converted to $B_2H_6$ gas that can be easily pumped out of the implanter 10. Alternatively, if fluorine were used as the source gas, the boron 10 contaminant material would be converted to $BF_3$ gas and then pumped out of the implanter. To remove photoresist contaminant material, oxygen would be used as the source gas. The photoresist material would be converted to $CO_2$ and $H_2O$ gases.

Another way to clean the neutralization apparatus 46 is by using the ion beam 16. The ion beam 16 is generated from a source material selected to react with the contaminant material to form a volatile gaseous species of the contaminant material. For example, when removing photoresist contaminant material, oxygen is used as the source of ions in the beam 16. The photoresist material would then be converted to $CO_2$ and $H_2O$ gases by the beam 16. The vaporized source material is injected into the plasma chamber 22.

The energy of the beam is set to a low energy of about 5–10 kilo-electron volts. The biased aperture 58 is energized by application of a negative 300 volt bias. The filaments 144 are not energized during this process. By using an ion beam having low energy, the velocity of the ions in the beam is reduced, thereby causing the ions to repel each other. This mode of operation causes a "blow up" of the ion beam 16 as it passes through the biased aperture 58 and, since the beam is not subsequently neutralized by electron emissions as it passes through the target 60 and the extension tube 62, the ions remain positively charged and tend to diverge to an even greater extent in the extension tube 62 and downstream from the extension tube because of the like charges of the ions.

The expansion of the ion beam 16 occurs at the target 60 and extension tube 62 because the biased aperture 58 has the negative bias applied to it. The beam 16 enters the neutralization apparatus 46 having its normal diameter during ion implantation, and then expands in diameter downstream of the biased aperture 58. The interior surfaces of the target 60 and the extension tube 62 are then cleaned when the expanded beam 16 comes into contact with them. The vacuum pumps 28 pump the contaminant material from the implanter 10.

In Situ Cleaning of the Implantation Chamber

The implantation chamber 20 is cleaned using a plasma glow discharge, in one of two ways. One way in which the implantation chamber 20 is cleaned is by applying a negative electrical bias from an outside power source (not shown) to either the chamber walls 193 or the wafer support 190, while grounding the other. The chamber walls 193 are electrically isolated from the wafer support 190. Thus, a negative bias is applied to the wafer support 190 and the chamber walls 193 are grounded. The wafer support 190 then functions as a cathode and is cleaned. Conversely, a negative bias is applied to the chamber walls 193 from the outside power source, and the wafer support 190 is grounded. The chamber walls 193 then function as cathodes and are cleaned.

A plasma glow discharge is created in the implantation chamber 20 in the manner discussed above with respect to the neutralization apparatus 46. That is, either the chamber walls 193 or the wafer support 190 is caused to function as a cathode, a reactive gas is fed into the implantation chamber 20, and the filaments 144 are energized. The vacuum pumps 28 pump the volatile species from the implantation chamber 20, where they are vented outside the implanter 10.

Another way the implantation chamber 20 is cleaned is by disposing the electrically insulating feed-through 194 through the opening 196 in the implantation chamber 20. The electrode 198 is disposed in the recess 200 in the wall 191 of the implantation chamber 20. The electrical connection 202 extends through the feed-through 194 to the electrode 198. A positive bias is applied from the outside power source via the electrical connection 202 to the electrode 198, making the wafer support 190 and the chamber walls 193 cathodes.

A plasma glow discharge is then generated in the implantation chamber 20 in the manner discussed above with respect to the neutralization apparatus 46. That is, the positive bias is applied to the electrode 198, a reactive gas is fed into the implantation chamber 20, and the filaments 144 are energized. The vacuum pumps 28 pump the volatile species from the implantation chamber 20, where they are vented outside the implanter 10.

Regarding suitable parameters for the process of cleaning the implantation apparatus, a cathode or an anode voltage of about 300 volts is expected to be used. The cathode or anode current is expected to be in a range of between 150 milliamps to 300 milliamps. The filament voltage and current are expected to be about 12 volts and about 15 amps, respectively. The gas flow rate is expected to be in a range of 5 to 10 standard cubic centimeters per minute. The cleaning time is expected to be about 30 minutes.

While the present invention has been described in some degree of particularity, it is to be understood that those of ordinary skill in the art may make certain additions or modifications to, or deletions from, the described present embodiment of the invention without departing from the spirit or scope of the invention, as set forth in the appended claims.

What is claimed is:

1. A self-cleaning ion beam neutralization apparatus comprising
   a hollow body extending from support structure of an ion beam implantation system,
   electron emitting means for emitting high energy electrons to an inner wall of said body to produce low energy secondary electrons or for extracting low energy electrons from a plasma in the interior of said body,
   an elongated hollow member adjacent and electrically isolated from said body, and
   cleaning means for creating a plasma glow discharge to clean contaminant material from said body and said elongated member.

2. The ion beam neutralization apparatus of claim 1 wherein said cleaning means includes apparatus for feeding a reactive gas into said neutralization apparatus.

3. The ion beam neutralization apparatus of claim 2 wherein said cleaning means further includes biasing means for applying a first electrical bias to one of said body and said elongated member and a second, higher electrical bias to the other.

4. The ion beam neutralization apparatus of claim 3 wherein said cleaning means further includes electron emitting means, which is energized to initiate the glow discharge.

5. The ion beam neutralization apparatus of claim 4 wherein said cleaning means further includes a pump for pumping contaminant material from the neutralization apparatus.

6. The ion beam neutralization apparatus of claim 1 further comprising a grounded support flange to which the body is connected, the flange being mounted to the support structure.

7. The ion beam neutralization apparatus of claim 1 further comprising
   a first aperture defining member adjacent and electrically isolated from said body, and
   a second aperture defining member adjacent and electrically isolated from said first aperture defining member, wherein said cleaning means cleans said first and second aperture defining members.

8. A self-cleaning ion implantation apparatus that normally intercepts a path of an ion beam in an ion beam implantation system, said implantation apparatus comprising
   a housing having an inner wall that defines an ion beam implantation chamber,
   a rotatable wafer support located in said implantation chamber for supporting wafers that are normally doped by the ion beam, and
   cleaning means for creating a plasma glow discharge in said implantation chamber to clean contaminant material adhering to said inner wall and said wafer support.

9. The ion implantation apparatus of claim 8 wherein said cleaning means includes apparatus for feeding a reactive gas into said implantation chamber.

10. The ion implantation apparatus of claim 9 wherein said cleaning means further includes biasing means for applying a negative electrical bias to either said inner wall or said wafer support while grounding the other.

11. The ion implantation apparatus of claim 9 wherein said cleaning means includes an electrode extending into and electrically isolated from said housing, said electrode having a positive electrical bias applied thereto.

12. The ion implantation apparatus of claim 9 wherein said cleaning means further includes electron emitting means, which is activated to initiate the glow discharge.

13. The ion implantation apparatus of claim 12 wherein said cleaning means further includes a pump for pumping the contaminant material from the ion implantation apparatus.

14. A method of cleaning contaminant material adhered to interior surfaces of an ion beam neutralization apparatus comprising the steps of feeding a reactive gas to a neutralization apparatus having at least two components that are electrically isolated from each other, applying a negative electrical bias to at least one of said components, grounding at least one of said components that does not have the negative bias applied thereto, creating a plasma glow discharge in the neutralization apparatus to remove contaminant material from said components, and removing the contaminant material from the neutralization apparatus.

15. The method of claim 14 wherein the reactive gas is one or more gases selected from the group consisting of hydrogen, fluorine, and oxygen.

16. The method of claim 14 further comprising the step of adjusting pressure in the neutralization apparatus to above vacuum pressure.

17. The method of claim 14 further comprising the step of providing a source of electrons to initiate the glow discharge.

18. The method of claim 14 wherein said gas reacts with the contaminant material to produce a volatile species of the contaminant material, and said volatile species is removed from the neutralization apparatus.

19. A method of cleaning contaminant material adhered to interior surfaces of an ion beam neutralization apparatus comprising the steps of feeding a reactive gas to a neutralization apparatus including a hollow body connected to support structure of an ion beam implantation system, electron emitting means for emitting high energy electrons to an inner wall of said body to produce low energy secondary electrons or for extracting low energy electrons from a plasma in the interior of said body, a first aperture defining member connected to said body and electrically isolated therefrom, a second aperture defining member connected to said first aperture defining member and electrically isolated therefrom, and an elongated hollow member connected to said body and electrically isolated therefrom, applying a negative electrical bias to at least one component selected from the group consisting of said body, said first aperture defining member, said second aperture defining member, and said elongated member, grounding at least one of said components that does not have the negative bias applied thereto, creating a plasma glow discharge in the neutralization apparatus causing the reactive gas to react with contaminant material adhered to said component having the negative bias applied thereto to produce a gaseous reaction product of the contaminant material, and removing the reaction product from the neutralization apparatus.

20. A method of cleaning contaminant material adhering to an ion implantation apparatus that normally intercepts a path of an ion beam in an ion beam implantation system, said method comprising the steps of feeding a reactive gas to an ion implantation apparatus including a housing having walls that define an ion implantation chamber in which a rotatable support for wafers is disposed, providing a positive electrical bias to an electrode member connected to and electrically isolated from said walls, creating a plasma glow discharge in said implantation chamber to remove contaminant material adhered to said chamber wall and said support, and removing the contaminant material from the implantation chamber.

21. The method of claim 20 further comprising the step of adjusting pressure in the implantation chamber to above vacuum pressure.

22. The method of claim 20 further comprising the step of providing a source of electrons to initiate the glow discharge.

23. A method of cleaning contaminant material adhering to an ion implantation apparatus that normally intercepts a path of an ion beam in an ion beam implantation system, said method comprising the steps of feeding a reactive gas to an ion implantation apparatus including a housing having walls that define an ion implantation chamber in which a rotatable support for wafers is disposed, applying a negative electrical bias to either said chamber wall or said support, grounding the one of said chamber wall and said support that does not have the applied negative bias, creating a plasma glow discharge in said implantation chamber to remove contaminant material adhered to the one of said chamber wall and said support that has said applied negative bias, and removing the contaminant material from the implantation chamber.

24. A method of cleaning contaminants adhered to interior surfaces of an ion beam neutralization apparatus that normally extends around a path of an ion beam in an ion beam implantation system, comprising the steps of extracting ions from source materials and forming the ions into an ion beam that traverses a beam path through an evacuated region along a trajectory to an ion implantation chamber, expanding the ion beam in the neutralization apparatus into contact with contaminant material adhered to interior surfaces of the neutralization apparatus, and removing the contaminant material from the neutralization apparatus.

25. The method of claim 24 wherein the ion beam is expanded in the neutralization apparatus by adjusting the energy of the beam and energizing an aperture member of the neutralization apparatus.

26. The method of claim 25 wherein the energy of the ion beam is adjusted to a range of 5–10 kilo-electron volts.

27. The method of claim 24 wherein the source materials are selected to form a volatile species of the contaminant material.

* * * * *